(12) United States Patent
Stonelake et al.

(10) Patent No.: US 11,360,885 B2
(45) Date of Patent: Jun. 14, 2022

(54) WEAR LEVELING BASED ON SUB-GROUP WRITE COUNTS IN A MEMORY SUB-SYSTEM

(71) Applicant: Micron Technology, Inc., Boise, ID (US)

(72) Inventors: Paul Stonelake, San Jose, CA (US); Ning Chen, San Jose, CA (US); Fangfang Zhu, San Jose, CA (US); Alex Tang, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 96 days.

(21) Appl. No.: 16/797,650

(22) Filed: Feb. 21, 2020

(65) Prior Publication Data

US 2021/0019254 A1    Jan. 21, 2021

Related U.S. Application Data

(60) Provisional application No. 62/874,294, filed on Jul. 15, 2019.

(51) Int. Cl.
*G06F 12/02* (2006.01)
*G11C 16/34* (2006.01)
*G06F 11/30* (2006.01)

(52) U.S. Cl.
CPC ...... *G06F 12/0246* (2013.01); *G06F 11/3037* (2013.01); *G06F 12/0292* (2013.01); *G11C 16/349* (2013.01); *G06F 2212/7211* (2013.01)

(58) Field of Classification Search
CPC ............. G06F 12/0246; G06F 12/0292; G06F 11/3037; G06F 2212/7211; G06F 2201/88; G06F 2212/7208; G06F 2212/1036; G11C 16/349; G11C 2211/5641

See application file for complete search history.

(56) References Cited

U.S. PATENT DOCUMENTS

| | | | | |
|---|---|---|---|---|
| 2007/0294490 A1* | 12/2007 | Freitas | ............. | G06F 13/1668 711/154 |
| 2008/0028152 A1* | 1/2008 | Du | ............. | G06F 12/0864 711/129 |
| 2012/0131381 A1* | 5/2012 | Eleftheriou | ............. | G06F 3/0688 714/6.3 |
| 2019/0129768 A1* | 5/2019 | Novogran | ............. | G06F 11/3013 |

* cited by examiner

*Primary Examiner* — Reginald G Bragdon
*Assistant Examiner* — Sakhr A Aldaylam
(74) *Attorney, Agent, or Firm* — Schwegman Lundberg & Woessner, P.A.

(57) ABSTRACT

In an embodiment, a system includes a plurality of memory components that each include a plurality of management groups. Each management group includes a plurality of sub-groups. The system also includes a processing device that is operatively coupled with the plurality of memory components to perform wear-leveling operations that include maintaining a sub-group-level delta write count (DWC) for each of the sub-groups of each of the management groups of a memory component in the plurality of memory components. The wear-leveling operations also include determining, in connection with a write operation to a first sub-group of a first management group of the memory component, that a sub-group-level DWC for the first sub-group equals a management-group-move threshold, and responsively triggering a management-group-move operation from the first management group to a second management group of the memory component.

20 Claims, 11 Drawing Sheets

| SMU | SMU DWC | SUB-GROUP 01 DWC | SUB-GROUP 02 DWC | SUB-GROUP 03 DWC | SUB-GROUP 04 DWC |
|---|---|---|---|---|---|
| SMU 310 | SMU-LEVEL DWC 510 | SG-LEVEL DWC 511 | SG-LEVEL DWC 512 | SG-LEVEL DWC 513 | SG-LEVEL DWC 514 |
| SMU 320 | SMU-LEVEL DWC 520 | SG-LEVEL DWC 521 | SG-LEVEL DWC 522 | SG-LEVEL DWC 523 | SG-LEVEL DWC 524 |
| SMU 330 | SMU-LEVEL DWC 530 | SG-LEVEL DWC 531 | SG-LEVEL DWC 532 | SG-LEVEL DWC 533 | SG-LEVEL DWC 534 |
| SMU 340 | SMU-LEVEL DWC 540 | SG-LEVEL DWC 541 | SG-LEVEL DWC 542 | SG-LEVEL DWC 543 | SG-LEVEL DWC 544 |

DWC SEGMENT 402

| LWC SEGMENT 404 | |
|---|---|
| SMU | LWC OFFSET |
| SMU 310 | LWC OFFSET 610 |
| SMU 320 | LWC OFFSET 620 |
| SMU 330 | LWC OFFSET 630 |
| SMU 340 | LWC OFFSET 640 |

FIG. 6

WEAR LEVELING BASED ON SUB-GROUP WRITE COUNTS IN A MEMORY SUB-SYSTEM

CROSS-REFERENCE TO RELATED APPLICATIONS

This application claims the benefit of U.S. Provisional Patent Application Ser. No. 62/874,294, filed Jul. 15, 2019 and entitled "Wear Leveling Based on Sub-Group Write Counts in a Memory Sub-System," the entirety of which is hereby incorporated herein by reference.

TECHNICAL FIELD

Embodiments of the disclosure relate generally to memory sub-systems and more specifically to wear leveling based on sub-group write counts in a memory sub-system.

BACKGROUND

A memory sub-system can be a storage device, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 5 is a block diagram of a first example segment of the management table of FIG. 4 in accordance with some embodiments of the present disclosure.

FIG. 6 is a block diagram of a second example segment of the management table of FIG. 4 in accordance with some embodiments of the present disclosure.

DETAILED DESCRIPTION

Figure 1:
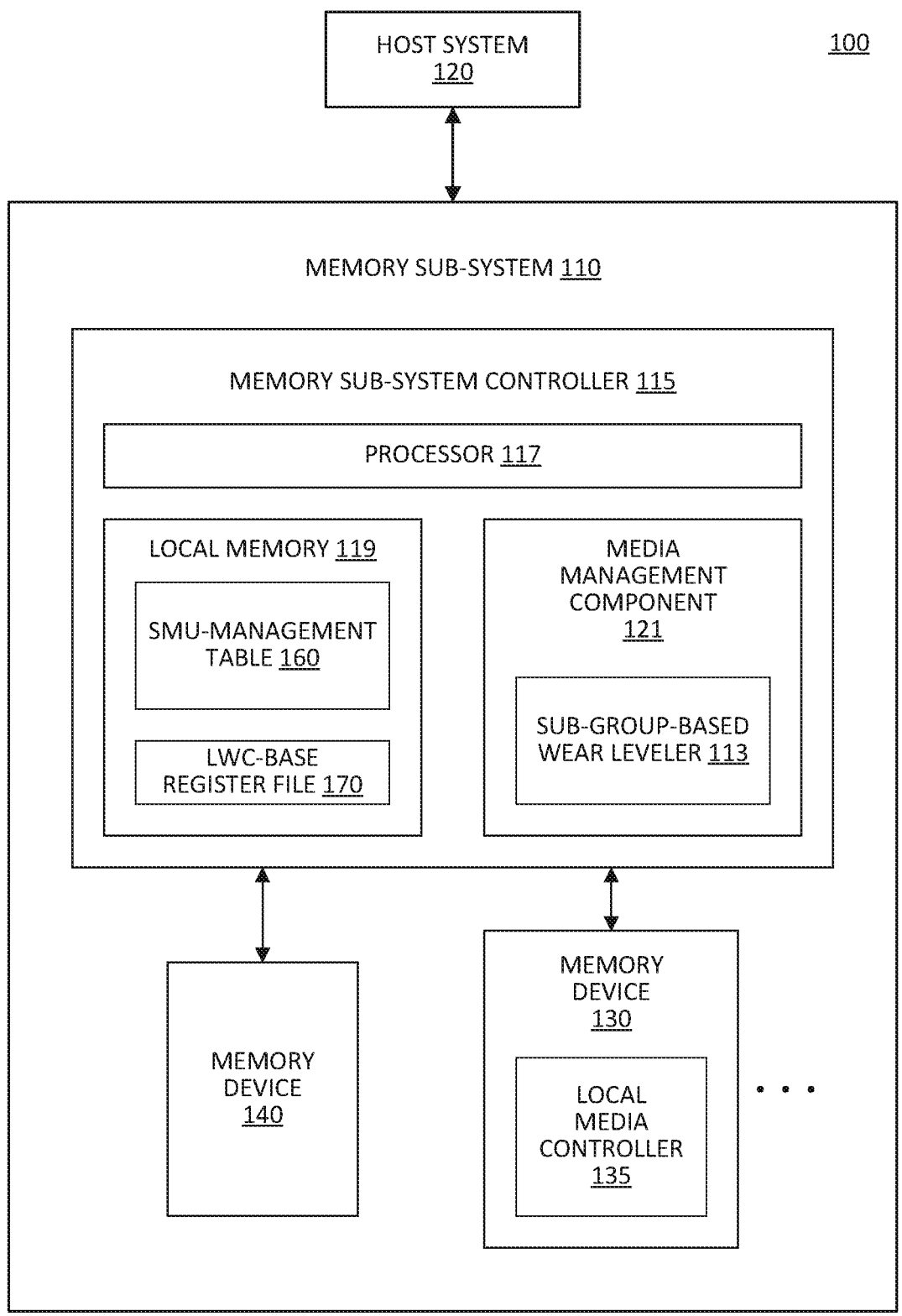
FIG. 1 illustrates an example computing environment that includes a memory sub-system that includes a memory sub-system controller in accordance with some embodiments of the present disclosure.

Aspects of the present disclosure are directed to wear leveling based on sub-group write counts in a memory sub-system. A memory sub-system can be a storage device, a memory module, or a hybrid of a storage device and a memory module. Examples of storage devices and memory modules are described below in connection with FIG. 1. In general, a host system can utilize a memory sub-system that includes one or more memory components (also referred to herein as "memory devices"). The host system can provide data to be stored at the memory sub-system and can request data to be retrieved from the memory sub-system. The host system can send access requests to the memory sub-system, such as to store data at the memory sub-system and to read data from the memory sub-system. The data to be read and written are hereinafter referred to as "user data". A host request can include a logical address (e.g., logical block address (LBA)) for the user data, which is the location the host system associates with the user data. The logical address (e.g., LBA) can be part of metadata for the user data.

The memory components can include non-volatile and volatile memory devices. A non-volatile memory device is a package of one or more dice. The dice in the packages can be assigned to one or more channels for communicating with a memory sub-system controller. The non-volatile memory devices include cells (i.e., electronic circuits that store information), that are grouped into pages to store bits of data.

A memory sub-system can perform internal management operations, such as media management operations (e.g., defect scanning, wear leveling, refresh), on the non-volatile memory devices to manage the memory devices. The storing of user data at a memory device can increase the wear of the memory device. After a threshold amount of write operations, the wear can cause the memory device to become unreliable so that user data can no longer be reliably stored and retrieved from the memory device. At such a point, the memory sub-system can result in a failure when any of the memory devices fails.

Some memory components, such as non-volatile memory components, have limited endurance. One aspect of this limited endurance is that the underlying hardware elements that store the user data can only have user data written to them a finite number of times before they become worn and no longer function reliably.

One technique for managing the endurance in memory sub-systems with physical components having limited use cycles (e.g., a limited number of write and/or read cycles before expected failure) is wear leveling. Wear leveling is a process that helps reduce premature wear in memory devices by distributing write operations across the memory devices. Wear leveling includes a set of operations to determine which physical media (e.g., set of memory cells) to use each time user data is programmed to help ensure that certain physical sets of memory cells are not written and erased more often than others. A wear leveling operation can attempt to evenly distribute the wear operations write, read, erase, etc.) operations, and thus the corresponding physical wear, across data memory devices or portions of memory devices, thus limiting the probability of certain portions of the memory sub-system failing before others.

One approach that has been developed to mitigate this issue involves delineating the memory cells of the memory device. The non-volatile memory devices can include, for example, three-dimensional cross-point ("3D cross-point") memory devices that are a cross-point array of non-volatile memory that can perform bit storage based on a change of bulk resistance, in conjunction with a stackable cross-gridded data access array.

Such non-volatile memory devices can group pages across dice and channels to form management units (MUs). An MU can include user data and corresponding metadata. A memory sub-system controller can send and receive user data and corresponding metadata as management units to and from memory devices. A super management unit (SMU) is a group of one or more MUs that are managed together. For example, a memory sub-system controller can perform media management operations (e.g., wear level operations, refresh operations, etc.) on SMUs.

A physical super management unit (PSMU) is a group of one or more managements units (MUs). A logical super management unit (LSMU) is a logical group of one or more logical addresses (e.g., logical block addresses (LBAs)). LSMUs can be mapped to different PSMUs at different points in time.

Furthermore, the memory sub-system controller can maintain a write count for each SMU in the memory sub-system. The write count can be stored in a static RAM (SRAM) data table referred to herein as an SMU-management table (or simply a management table). The memory sub-system controller maintains a write count for each SMU of the memory sub-system.

Each write count for each SMU can include multiple (e.g., two) write counts: a delta write count (DWC) and a life write count (LWC). Each time the memory sub-system controller directs a write operation to one or more MUs within a given SMU, the memory sub-system controller increments the DWC for that SMU. When the DWC reaches a threshold that is referred to herein as the SMU-move threshold, the memory sub-system controller resets the DWC for that SMU, increments the LWC for that SMU, and conducts an SMU-move operation in which the memory sub-system controller selects an available SMU (referred to here as the second SMU) elsewhere in the memory sub-system and then moves the user data that is currently stored in that SMU to the second SMU. In connection with an SMU-move operation, the memory sub-system controller also reassigns the logical addresses (e.g., LBAs) that had previously been assigned to the original SMU to then be assigned to the second SMU.

The memory sub-system controller can track subsequent write operations to the second SMU by incrementing its DWC, which starts the cycle in a reset state (e.g., equal to zero) to accord with the fact that the DWC for an SMU is a count of the write operations to that SMU since the more recent of (i) an initialization (or re-initialization) of the memory component and (ii) the most recent SMU-move operation directed to that SMU. When the DWC for the second SMU reaches the SMU-move threshold, the memory sub-system controller resets the DWC and increments the LWC for the second SMU, and then conducts an SMU-move operation from the second SMU to yet another SMU. This approach falls under the category of what are known as wear-leveling operations in the management of the memory sub-system by the memory sub-system controller). Once the LWC for a given SMU reaches an LWC threshold, the memory sub-system controller may take one or more responsive actions such as discontinuing use of that particular SMU, discontinuing use of the entire memory component, disabling the entire memory sub-system, alerting the host system, and/or one or more other responsive actions.

Each SMU-move operation consumes processing power and time, both on the memory sub-system controller and on the corresponding memory component. Thus, all other things being equal, the fewer the better. In current implementations, however, any write operation to any part of a given SMU counts as a write operation to the entire SMU in that the write operation causes the DWC for that SMU to be incremented, hastening the next SMU-move operation, and thereby increasing the number of SMU-move operations that will, on average, occur during any given time period. As will be understood from the above explanation of DWCs and LWCs, this shortens the lifespan of SMUs, memory components, and in some cases even entire memory-subsystems. This is in spite of the fact that write operations that are, for the most part, spread evenly across different portions of a given SMU do not really cause repeated wear on the same physical storage components, though they are treated in current memory-sub-system implementations as if they do. Moreover, different types of memory components implement different SMU sizes, and this problem is exacerbated in memory components that use larger SMU sizes.

Aspects of the present disclosure address the above and other deficiencies by wear leveling based on sub-group write counts in a memory sub-system. In accordance with at least one embodiment, the memory sub-system controller includes a media management component that maintains DWCs at a finer granularity than the SMU level. In at least one implementation, the media management component treats each SMU in a memory component as being delineated into a plurality of what are referred to herein as sub-groups, each of which is a defined subset of the physical storage elements of the SMU. For each SMU, the media management component maintains a sub-group-level DWC for each of the sub-groups in the SMU. The media management component still maintains LWCs at the SMU level but, in at least one implementation, does so in a manner that, as described below, at least partially offsets the additional storage space—additional as compared with current implementations—that is occupied in the SMU-management table by the sub-group-level DWCs.

In at least one implementation of the present disclosure, a write operation being directed to a location that is within a given sub-group of a given SMU triggers the media management component to increment the associated sub-group-level DWC. Moreover, whenever any one of the sub-group-level DWCs for an SMU reaches the SMU-move threshold, this event triggers the media management component to reset each of the sub-group-level DWCs for that SMU, increment the LWC for that SMU, and conduct an SMU-move operation from that SMU to a different SMU. In some implementations, in addition to maintaining a sub-group-level DWC for each sub-group in each SMU, the media management component also maintains an SMU-level DWC for each SMU. Each SMU-level DWC can be thought of as a standalone value, but can also be thought of as representing the most significant bits (MSBs) of a combined DWC for which the associated sub-group-level DWCs provide the least significant bits (LSBs).

With respect to LWCs, in at least one implementation of the present disclosure, the media management component maintains, for each memory component, a value that is referred to herein as an LWC base. The media management component maintains these memory-component-level values in registers that are referred to herein as LWC-base registers, which are located in a storage area that is external to the SMU-management table and that is referred to herein as an LWC-base register file. The media management component also maintains, in the SMU-management table, a value referred to herein as an LWC offset for each SMU in each memory component. At any given time, in at least one implementation of the present disclosure, the LWC for an SMU of a memory component is represented by a concatenation of the LWC base for that memory component and the LWC offset for that SMU. The LWC base is the MSB portion of the LWC, while the LWC offset is the least-significant-bits (LSB) portion. Some example operations that the media management component performs in connection with these values are described below.

Among the benefits of implementations of the present disclosure is that SMU-move operations are triggered less often than they are in connection with current implementations. The reason for this is that it takes a greater number of write operations to reach the SMU-move threshold in implementations of the present disclosure than it does in current implementations of memory sub-systems. As such, less of a demand is put on the processing power and time of both the media management component (and the memory sub-system controller, more generally) and the individual memory components.

It could occur in very rare instances that an SMU-move operation is triggered in connection with implementations of the present disclosure after the same number of write operations that would cause an SMU-move operation to be triggered in connection with current implementations, though this would only occur in situations in which, following an SMU-move operation to a given SMU, every single write operation to that SMU is directed to a single one of the sub-groups of that SMU until the next SMU-move operation is triggered. In all other cases, SMU-move operations are triggered less frequently in connection with implementations of the present disclosure than they are in connection with current implementations. This comparison assumes of course that the SMU-move threshold for sub-groups in connection with implementations of the present disclosure is the same as the SMU-move threshold for SMUs in current implementations.

Other benefits of implementations of the present disclosure will be evident to those of skill in the art.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-system 110. FIG. 1 illustrates an example of the host system 120 coupled to one memory sub-system 110. The host system 120 uses the memory sub-system 110, for example, to write user data to the memory sub-system 110 and read user data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data (e.g., user data) between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, user data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices memory device 130) includes 3D cross-point type flash memory, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

In some embodiments, each of the memory devices 130 can include one or more arrays of memory cells such as single level cells (SLCs), multi-level cells (MLCs), triple level cells (TLCs), quad-level cells (QLCs), or a combination of such. In some embodiments, a particular memory component can include an SLC portion, and an MLC portion, a TLC portion, or a QLC portion of memory cells. Each of the memory cells can store one or more bits of data used by the host system 120.

Furthermore, the memory cells of the memory devices 130 can be grouped as memory pages or memory blocks that can refer to a unit of the memory component used to store data. Memory pages can be grouped across dice and channels to form management units (MUs). An MU can include user data and corresponding metadata. A memory sub-system controller can send and receive user data and corresponding metadata as management units to and from memory devices. A super management unit (SMU) is a group of one or more MUs that are managed together. For example, a memory sub-system controller can perform media management operations (e.g., wear level operations, refresh operations, etc.) on SMUs.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or another suitable processor.

The memory sub-system controller 115 includes a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing microcode. While the example memory sub-system 110 in FIG. 1 is illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system 110).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear-leveling operations, garbage collection operations, error detection and error-correcting code (ECC) operations, encryption operations, caching operations, and address translations between a logical address logical block address (LBA)) and a physical address that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system controller 115 includes a media management component 121 to perform media management operations to manage the memory devices 130. In at least one implementation, operations such as wear-leveling operations are performed by the media management component 121. As depicted in FIG. 1, in at least one embodiment, the media management component 121 includes a sub-group-based wear leveler 113, which can take the form of or include circuitry, dedicated logic, programmable logic, firmware, software, and/or the like for carrying out at least the sub-group-based-wear-leveler functions described herein. In some embodiments, the memory sub-system controller 115 includes at least a portion of the sub-group-based wear leveler 113 the processor 117 can be configured to execute instructions stored in the local memory 119 for performing the sub-group-based-wear-leveler operations described herein. In some embodiments, the sub-group-based wear leveler 113 is part of the host system 120, an application, or an operating system.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller memory sub-system controller 115) can externally manage the media device 130 (e.g., perform media management operations on the media device 130). In some embodiments, the memory devices 130 can be locally managed memory devices, which is a raw memory device combined with a local media controller 135 that performs memory management operations on the memory device 130 within the same memory device package.

In the depicted embodiment, the local memory 119 includes an SMU-management table 160 and an LWC-base register file 170, both of which are described herein as being used by the sub-group-based wear leveler 113 to perform operations according to implementations of the present disclosure. In at least one embodiment, the sub-group-based wear leveler 113 is configured to maintain records in the SMU-management table 160 regarding sub-group-level DWCs, SMU-level DWCs, and LWC offsets, and is further configured to maintain LWC bases in registers in the LWC-base register file 170. Moreover, the sub-group-based wear leveler 113 is configured in accordance with some implementations of the present disclosure to instruct memory devices 130 to conduct SMU-move operations of their data from an SMU for which the SMU-level DWC has reached the SMU-move threshold to another, available SMU. Various functions that are carried out by the sub-group-based wear leveler 113 in different combinations in different embodiments are described throughout this disclosure.

Moreover, it is noted that the arrangement that is depicted in FIG. 1, in which the SMU-management table 160 and the LWC-base register file 170 are contained within the local memory 119, is by way of example and not limitation. In some implementations, one or both of the SMU-management table 160 and the LWC-base register file 170 can be contained within the media management component 121 or in other data storage within the memory sub-system controller 115. Alternatively, one or both of the SMU-management table 160 and the LWC-base register file 170 can be located within the memory device 130 or the memory device 140. Moreover, one or both could be stored on the host system 120.

Figure 2:
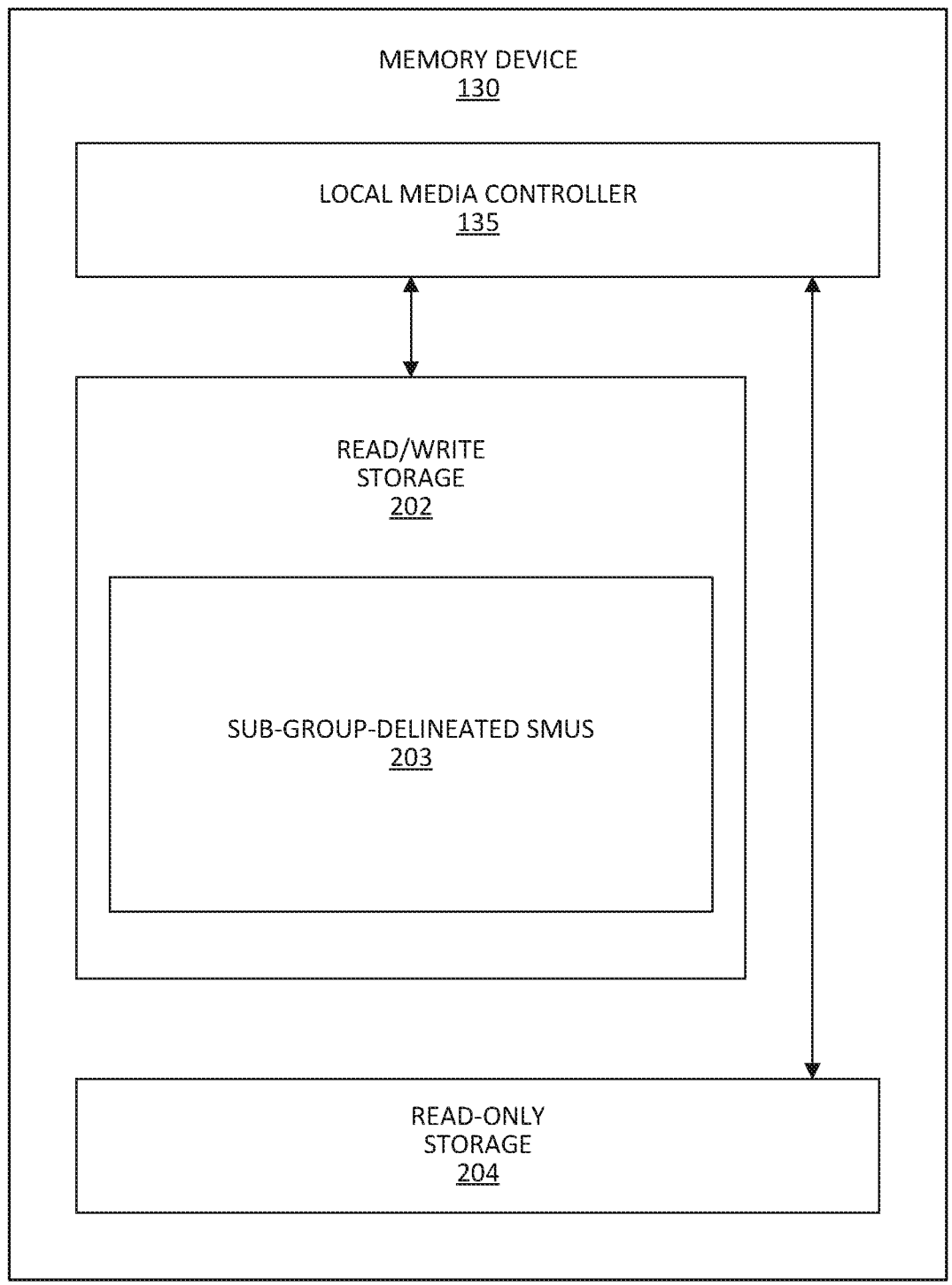
FIG. 2 is a block diagram of an example memory device of the memory sub-system of FIG. 1 in accordance with some embodiments of the present disclosure.

FIG. 2 is a block diagram of an example structure 200 of a memory device 130. Each of the memory devices 130 can have an internal structure similar to the structure of the memory device 130 that is depicted in and described by way of example in connection with FIG. 2. The memory device 140 could also have a similar internal structure. Moreover, the memory sub-system 110 can include any suitable number of memory devices 130 and memory devices 140.

As mentioned, in at least one embodiment, the memory device 130 includes the local media controller 135. As is further depicted in FIG. 2, in at least one embodiment, the memory device 130 also includes read/write storage 202 and read-only storage 204. This structure for the memory device 130 is presented by way of example and not limitation, as different structures can be used in different implementations. In at least one embodiment, the read/write storage 202 includes non-volatile data-storage elements to which the local media controller 135 can write data and from which the local media controller 135 can read data. As shown generally in FIG. 2 as sub-group-delineated SMUs 203, the read/write storage 202 can include multiple SMUs that are each delineated into multiple sub-groups. In one example, the memory device 130 is a NAND-type flash memory component. In another example, the memory device 130 is a 3D cross-point memory device. In at least one embodiment, the read-only storage 204 includes non-volatile data-storage elements from which the local media controller 135 can read data. The read-only storage 204 may contain data that is programmed at the time of manufacture of the memory device 130.

Figure 3:
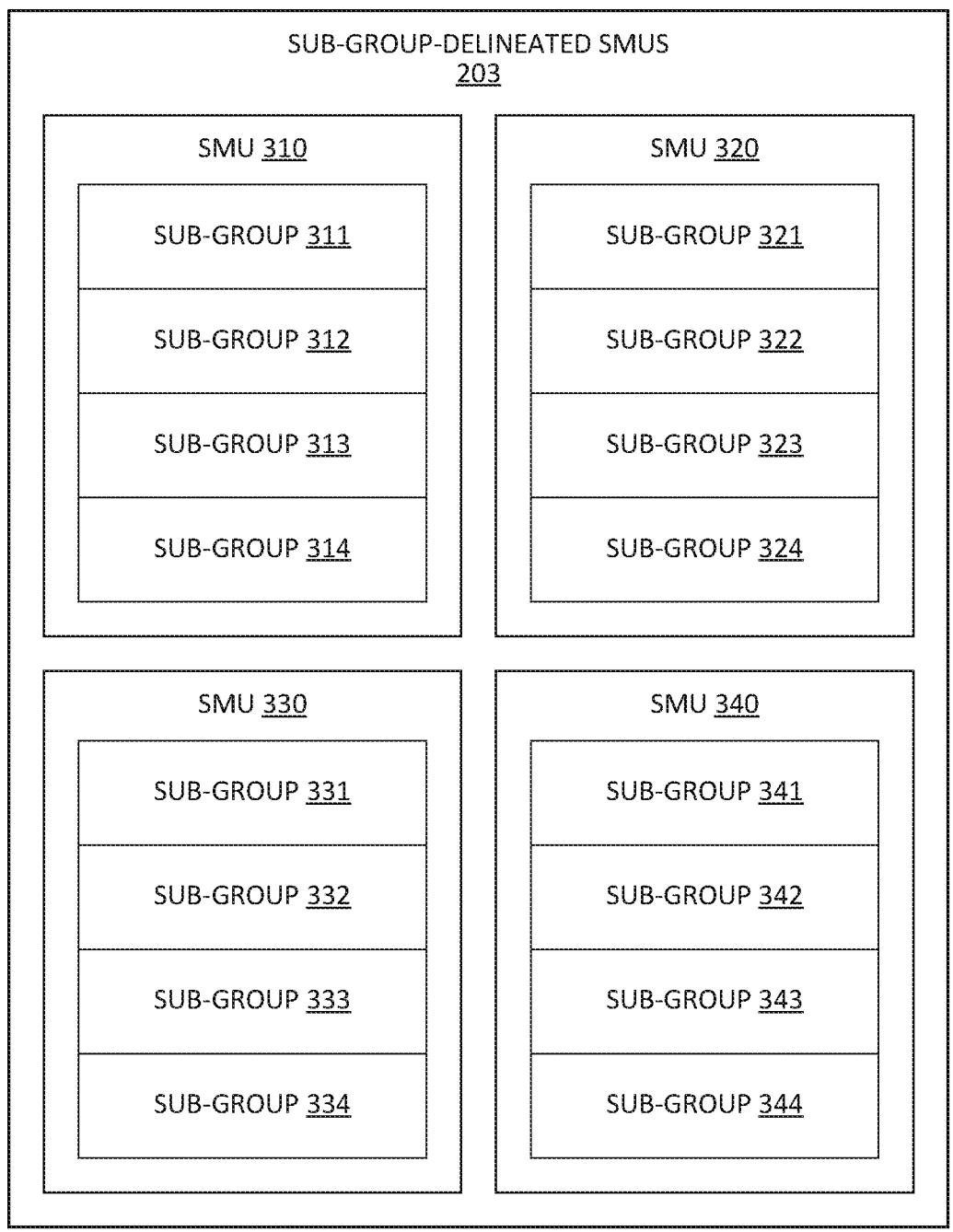
FIG. 3 is a block diagram of an example delineation of a read/write-storage portion of the memory device of FIG. 2 into a number of management groups each having a number of sub-groups in accordance with some embodiments of the present disclosure.

FIG. 3 depicts an example architecture 300 of the sub-group-delineated SMUs 203 of the read/write storage 202. In particular, the sub-group-delineated SMUs 203 is depicted as including four SMUs: an SMU 310, an SMU 320, an SMU 330, and an SMU 340. Each of the SMUs 310-340 is shown as having four sub-groups: the SMU 310 has sub-groups 311-314, the SMU 320 has sub-groups 321-324, the SMU 330 has sub-groups 331-334, and the SMU 340 has sub-groups 341-344. The depiction of the sub-group-delineated SMUs 203 as including four SMUs 310-340 and of each of those SMUs 310-340 as having four sub-groups 311-314, 321-324, 331-334, 341-344 is by way of example and not limitation. In any given instance, the sub-group-delineated SMUs 203 could include any number of SMUs and each SMU could include any number of sub-groups. Moreover, in some instances, different SMUs could have different numbers of sub-groups. Moreover, the SMUs and the sub-groups could be of any sizes deemed suitable by those of skill in the art for a given implementation.

Figure 4:
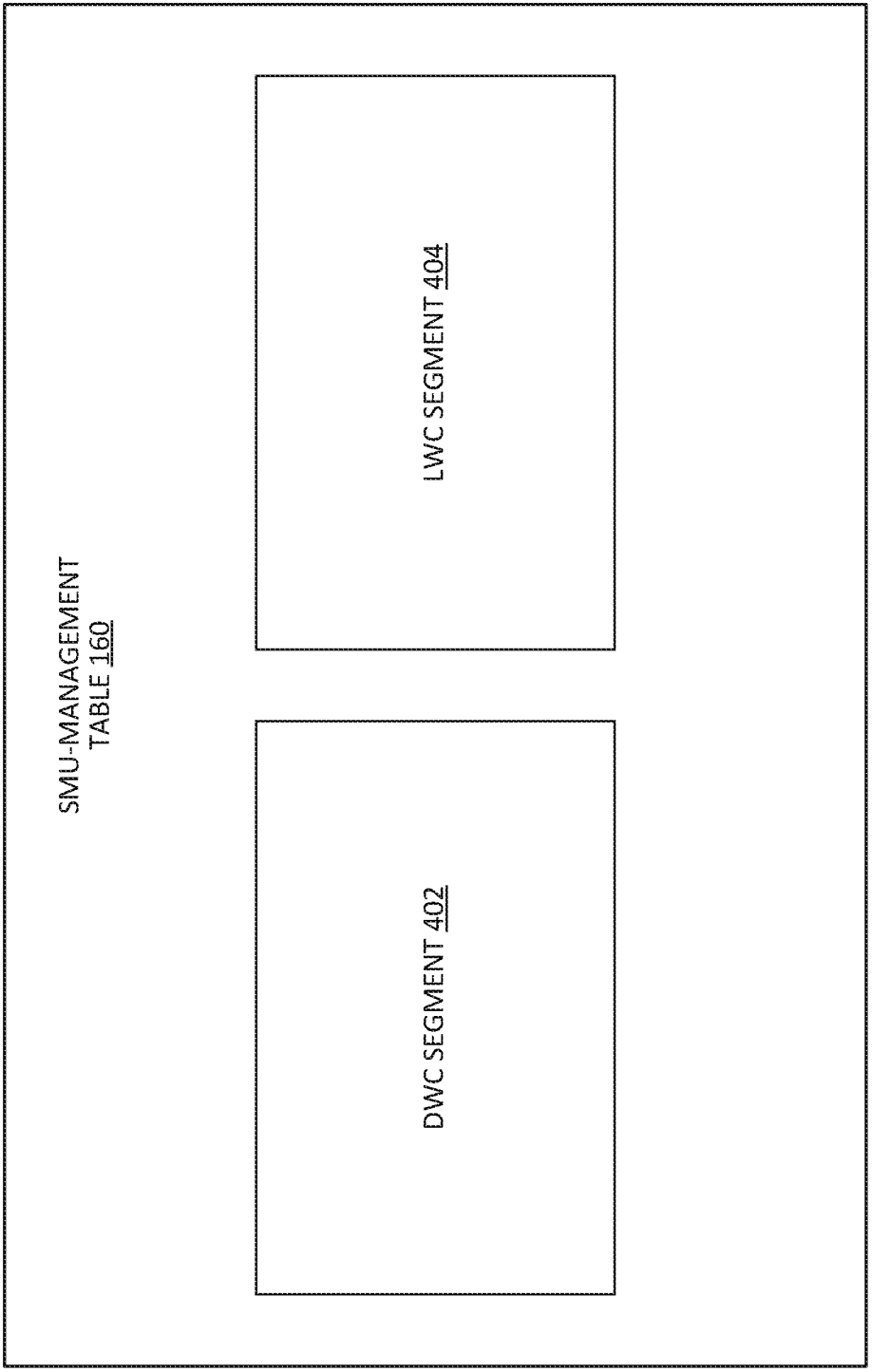
FIG. 4 is a block diagram of an example management table that can be used by the memory sub-system controller to perform operations in accordance with some embodiments of the present disclosure.

As described above, the sub-group-based wear leveler 113 can use the SMU-management table 160 to maintain records regarding the SMU-level DWCs of the SMUs 310-340 and the sub-group-level DWCs of the sub-groups 311-314, 321-324, 331-334, 341-344, as well as to maintain records regarding the LWC offsets of the various SMUs 310-340. As shown in FIG. 4 in an example architecture 400 of the SMU-management table 160, the SMU-management table 160 can include multiple different segments such as a DWC segment 402 and an LWC segment 404. Example ways in which the DWC segment 402 and the LWC segment 404 could be organized are discussed herein.

One example way in which the DWC segment 402 could be organized is shown in FIG. 5, which depicts an example architecture 500 of the DWC segment 402. As indicated in the title bar, the DWC segment 402 could be organized as a table having six columns: a first column that identifies the SMU 310-340 to which a given row pertains, a second column that contains an SMU-level DWC 510-540 for the particular SMU 310-340, and third through sixth columns that contain sub-group-level DWCs 511-514, 521-524, 531-534, 541-544 for the various sub-groups 311-314, 321-324, 331-334, 341-344 in the particular SMU. Moreover, it is noted that the first column is displayed primarily to assist the reader that is, in order to reduce the storage space occupied by the SMU-management table 160, the DWC segment 402 need not include the first column: the sub-group-based wear leveler 113 can be programmed to know which row corresponds with which SMU 310-340.

The first row of the DWC segment 402 pertains to the SMU 310 and includes the SMU-level DWC 510, the sub-group-level DWC 511, the sub-group-level DWC 512, the sub-group-level DWC 513, and the sub-group-level DWC 514. The second row pertains to the SMU 320 and contains the SMU-level DWC 520 and the sub-group-level DWCs 521-524. The third row pertains to the SMU 330 and contains the SMU-level DWC 530 and the sub-group-level DWCs 531-534. Finally, the fourth row pertains to the SMU 340 and contains the SMU-level DWC 540 and the sub-group-level DWCs 541-544. The sub-group-level DWC 511 corresponds with the sub-group 311 of the SMU 310, the sub-group-level DWC 512 with the sub-group 312, and so forth.

Any number of bits could be reserved for each of the SMU-level DWCs 510-540 and for each of the sub-group-level DWCs 511-514, 521-524, 531-534, 541-544. It is helpful to consider a hypothetical example in which, in a current implementation, an SMU-level DWC includes 17 bits, referred to as bits [16:0] when ordered left to right from the MSB to the LSB. In such an example, each SMU-level DWC could, at any given time, have any value in the range of 0-131,071 (decimal), inclusive, and every 131,072 write operations to an SMU would cause the LWC for that SMU to be incremented and an SMU-move operation to be performed to move data and logical-address assignment from that SMU to another.

In at least one implementation of the present disclosure, this same DWC range (0-131,071) is achieved with respect to each of the sub-group-level DWCs by allocating 13 bits for each SMU-level DWC 510-540 to correspond to the 13 MSBs and further by allocating 4 bits for each sub-group-level DWC 511-514, 521-524, 531-534, 541-544 to correspond to the 4 LSBs. In such an embodiment, each of the sub-group-level DWCs 511-514, 521-524, 531-534, 541-544 can take on values in the range 0-15 (decimal), inclusive. In this example, with respect to DWC-related storage, and as compared with the hypothetical prior implementation, an extra 12 bits would be occupied in the SMU-management table 160 for each of the SMUs of the memory sub-system 110.

Moreover, the LWC segment 404 could be organized in a number of different ways, one example of which is shown in the example architecture 600 of the LWC segment 404 that is depicted in FIG. 6. As indicated in the title row, the LWC segment 404 could be organized as a table having two columns: a first column that identifies the SMU 310-340 to which a given row pertains, and a second column that lists an LWC offset 610-640 for the particular SMU 310-340. As is the case with FIG. 5, the first column is displayed in FIG. 6 primarily to assist the reader to reduce the storage space that is occupied the SMU-management table 160, the LWC segment 404 need not include that first column, and the sub-group-based wear leveler 113 can be programmed to know which row (and therefore which LWC offset 610-640) is associated with which SMU 310-340.

Any suitable number of bits could be reserved in the LWC segment 404 for each of the LWC offsets 610-640. In an embodiment, 3 bits are reserved for each of the LWC offsets 610-640, and each of the LWC offsets 610-640 can therefore take on values in the range 0-7 (decimal), inclusive. As discussed herein, with respect to LWC-related data, some implementations of the present disclosure involve keeping only a certain number of the LSBs of the LWC for each SMU in the SMU-management table 160 (in the form of the LWC offsets 610-640) and storing, in the LWC-base register file 170, which is external to the SMU-management table 160, a single value that is representative of the MSBs of the LWC of all of the SMUs of a given memory device 130. Thus, some implementations of the present disclosure involve more DWC-related storage but less LWC-related storage in the SMU-management table 160 as compared with prior implementations.

An example method 700, an example method 800, and an example method 900 are described below in connection with FIG. 7, FIG. 8, and FIG. 9, respectively. Regarding these drawings and their accompanying descriptions, it should be understood that, although shown in a particular sequence, unless otherwise specified, the order of the operations that are depicted and described can be modified. Thus, the illustrated implementations should be understood only as examples, and it should further be understood that the illustrated operations can be performed in a different order, and that some operations can be performed in parallel. Additionally, one or more operations can be omitted in various embodiments. Thus, not all operations are carried out in connection with every implementation. Other methods are possible. Furthermore, the method 700, the method 800, and/or the method 900 can be performed by processing logic that can include hardware (e.g., circuitry, dedicated logic, programmable logic, microcode, etc.), software (such as instructions executed on a processing device), firmware, or a combination thereof.

Figure 7:
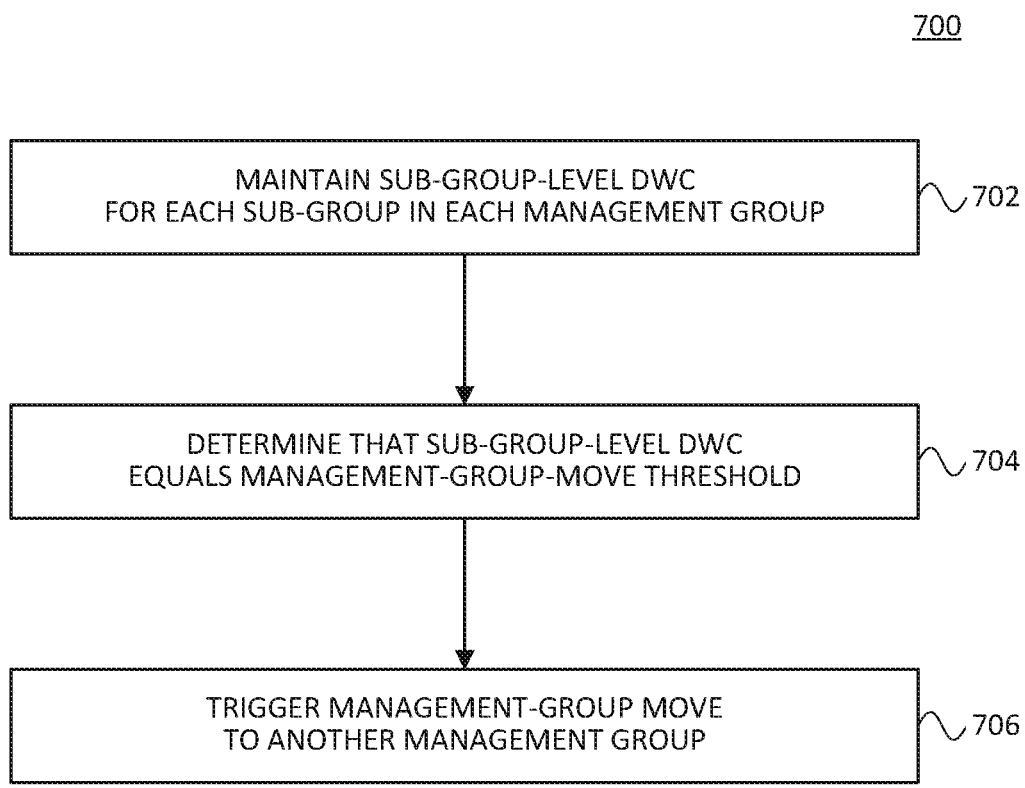
FIG. 7 is a flow diagram of an example method for wear leveling based on sub-group write counts in a memory sub-system that can be performed by the memory sub-system controller of FIG. 1 in accordance with some embodiments of the present disclosure.

FIG. 7 depicts a flow diagram of the example method 700 for wear leveling based on sub-group-level DWCs in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the sub-group based wear leveler 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more operations can be omitted in various embodiments. Thus, not all operations are required in every embodiment. Other method flows are possible.

As operation 702, the processing device maintains sub-group-level DWCs 511-514, 521-524, 531-534, 541-544 for each of the sub-groups 311-314, 321-324, 331-334, 341-344 of the management groups (e.g., SMUs 310-340) of the memory device 130. At operation 704, the processing device determines, in connection with a write operation to the sub-group 323 of a management group (e.g., the SMU 320) of the memory device 130, that the sub-group-level DWC 523 equals a management-group-move threshold, which is also referred to herein as the SMU-move threshold. In response to making this determination, at operation 706, the processing device performs a set of one or more of what are referred to herein as management-group-turnover (or SMU-turnover) operations. The set of one or more SMU-turnover operations includes triggering a management-group-move operation (e.g., an SMU-move operation) from the SMU 320 to a second management group (e.g., the SMU 340) of the memory device 130. In this example, the SMU 340 is unused and available to be the destination SMU of the referenced SMU-move operation.

It is noted that the phrase "in connection with a write operation" is used in the preceding paragraph, and that similar variants (e.g., "in connection with a first write operation," "in connection with a second write operation," "in connection with a third write operation," etc.) are used in various places in the present disclosure. In these instances, the processing device is described as performing one or more operations "in connection with" a given write operation. This language is intended to broadly cover the processing device performing the associated operations before, during, and/or after the referenced write operations, and is used primarily as an aid to the reader to avoid confusion among different examples.

Furthermore, the "set of one or more SMU-turnover operations" refers to a set of one or more operations that the processing device performs in various different implementations of the present disclosure upon determining that an SMU-move operation from one SMU (e.g., the SMU 320) to another SMU (e.g., the SMU 340) of a memory component (e.g., the memory device 130) is to be performed. As such, the operation 706 lists triggering an SMU-move operation from the SMU 320 to the SMU 340 as the first-described example SMU-turnover operation in the set of one or more SMU-turnover operations. Using the current example for illustration, the set of one or more SMU-turnover operations could also include resetting all of the sub-group-level DWCs 521-524 for the sub-groups 321-324 of the SMU 320. Another example is resetting the SMU-level DWC 520 for the SMU 320 in embodiments that include SMU-level DWCs. Another example is incrementing the LWC offset 620, which is associated in the LWC segment 404 with the SMU 320.

In implementations of the present disclosure, an SMU-move operation is triggered from a given SMU to a destination SMU when any one of the sub-group-level DWCs for the sub-groups of that given SMU reaches the SMU-move threshold. Thus, in the present example, it may be the case that, when the sub-group-level DWC 523 reaches the SMU-move threshold, the sub-group-level DWC 521, the sub-group-level DWC 522, and the sub-group-level DWC 524 are equal to various (possibly equal, possibly different) values greater than or equal to 0 and less than the SMU-move threshold.

Moreover, the description of a sub-group-level DWC reaching the SMU-move threshold is consistent with implementations that maintain standalone sub-group-level DWCs and do not also maintain SMU-level DWCs. As described below in connection with at least FIG. 8, the description of a sub-group-level DWC reaching the SMU-move threshold is also consistent with implementations that maintain both sub-group-level DWCs and SMU-level DWCs.

Figure 8:
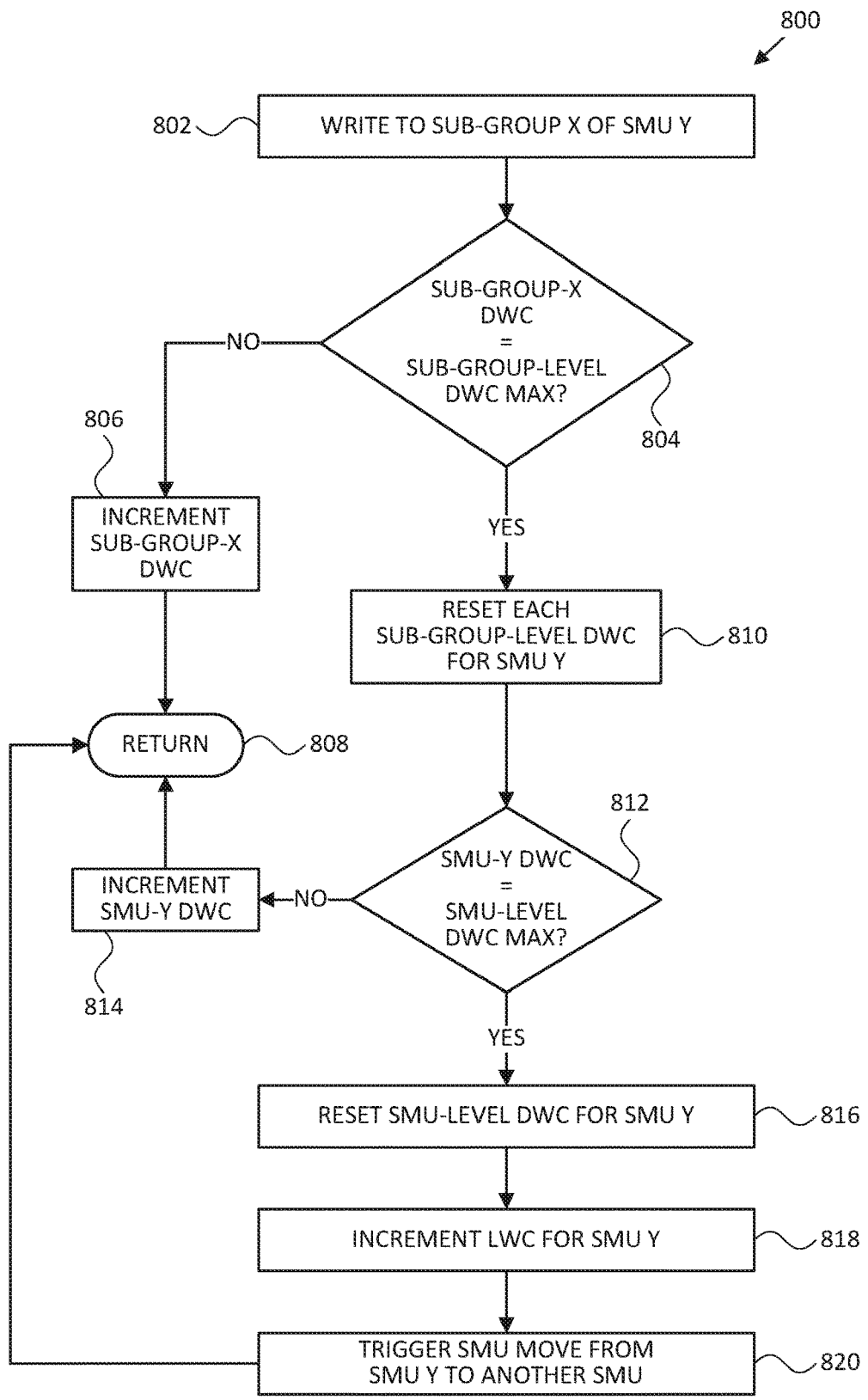
FIG. 8 is a flow diagram depicting some example operations performed by the memory sub-system controller of FIG. 1 in accordance with some embodiments of the present disclosure.

FIG. 8 depicts a flow diagram of the example method 800 for wear leveling based on sub-group-level DWCs in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the sub-group based wear leveler 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more operations can be omitted in various embodiments. Thus, not all operations are required in every embodiment. Other operations flows are possible.

The method 800 that is depicted in and described below in connection with FIG. 8 is in the context of the latter type of implementation, and breaks "a sub-group-level DWC reaching the SMU-move threshold" into two parts: (i) the sub-group-level DWC reaching the maximum allowed value for sub-group-level DWCs and (ii) the associated SMU-level DWC reaching the maximum allowed value for SMU-level DWCs.

The method 800 is performed, in at least one implementation of the present disclosure, by the processing device upon a determination being made to conduct a write operation, referred to herein as a "first" write operation, to the sub-group 323 of the SMU 320. It is noted that reference to this write operation and being "first" and to other below-described write operations as being "second," "third", and/or the like has nothing to do with the time sequence in which these write operations are performed. These are just labels to assist the reader in distinguishing among different examples involving different write operations.

In the present example, the processing device performs the first write operation to the sub-group 323 of the SMU 320 (see operation 802). Next, the processing device evaluates (at operation 804) whether the sub-group 323 is equal to a maximum allowed sub-group-level DWC value (referred to herein as the sub-group-level DWC max). In this example, with 4 bits allocated to each of the sub-group-level DWCs 511-514, 521-524, 531-534, 541-544, the sub-group-level DWC max is 15. It is noted that, at this point in the example method 800, the sub-group-level DWC 521 has not been incremented.

If the processing device determines at operation 804 that the sub-group-level DWC 521 is not equal to the sub-group-level DWC max, control proceeds to operation 806, at which the processing device increments the sub-group-level DWC 521. Control then proceeds to the operation 808, where the method 800 returns (to its calling function, process, and/or the like).

If, however, the processing device determines at operation 804 that the sub-group-level DWC 521 is equal to the sub-group-level DWC max, then, at operation 810, the processing device resets each of the sub-group-level DWCs 521-524 for the SMU 320. Control then proceeds to operation 812, where the processing device evaluates whether the SMU-level DWC 520 is equal to a maximum allowed SMU-level DWC value (referred to herein as the SMU-level DWC max). In this example, with 13 bits allocated to each of the SMU-level DWCs 510-540, the SMU-level DWC max is 8,191. When the SMU-level DWCs and the sub-group-level DWCs are viewed as being the MSBs and the LSBs, respectively, of a combined DWC, it can be seen that the SMU-move threshold in this example is 131,071.

Continuing the example, if the processing device determines at operation 812 that the SMU-level DWC 520 is not equal to (and therefore is less than) the SMU-level DWC max, then the processing device increments the SMU-level DWC 520 (see operation 814) and then the method 800 returns at operation 808. If, however, the processing device determines at operation 812 that the SMU-level DWC 520 is equal to the SMU-level DWC max, then the processing device performs a set of SMU-turnover operations: the processing device resets the SMU-level DWC 520 (see operation 816), increments the LWC offset 620 (see operation 818), and triggers an SMU-move operation from the SMU 320 to the SMU 340 (as an example available SMU) (see operation 820). The method 800 then returns at operation 808.

Figure 9:
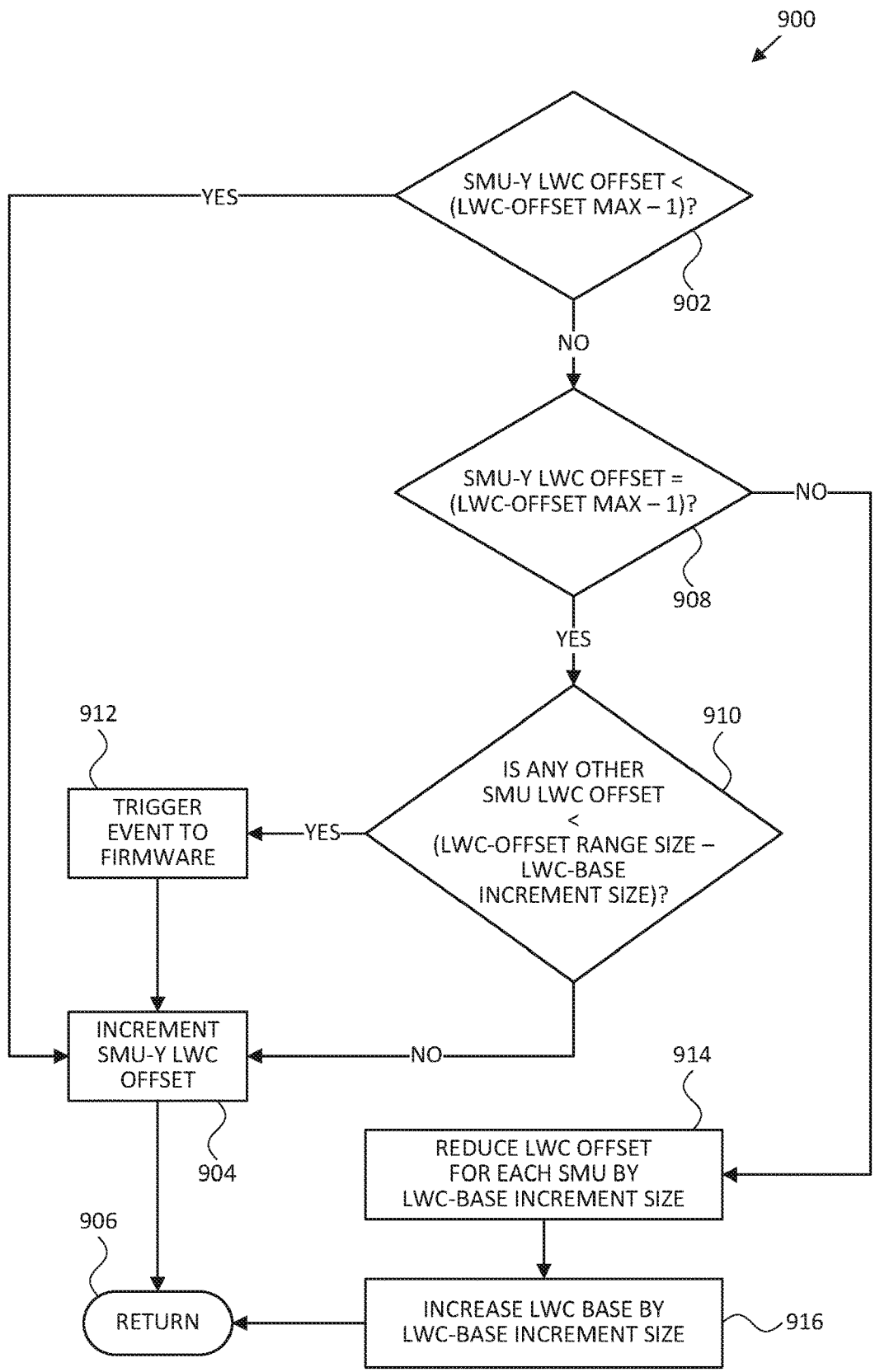
FIG. 9 is a flow diagram depicting some example operations performed by the memory sub-system controller of FIG. 1 in accordance with some embodiments of the present disclosure.

Some example operations—that are performed in some implementations of the present disclosure as part of incrementing the LWC offset 620 at operation 818—are described here in connection with an example method 900 that is depicted in FIG. 9.

FIG. 9 depicts a flow diagram of the example method 900 for wear leveling based on sub-group-level DWCs in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the sub-group based wear leveler 113 of FIG. 1. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. Other operations flows are possible.

In some embodiments, however, the performing of the method 800 does not involve a complete performing of the method 900, but rather involves performing one or more but not all of the operations of the method 900. Some embodiments of the present disclosure involve the performing of one but not the other of the method 800 and the method 900. As is the case with the method 800, the method 900 is described herein by way of example and not limitation as being performed by the memory sub-system controller 115 with respect to the memory device 130. In some instances, it is the sub-group-based wear leveler 113 in particular that performs the method 900.

As described above, in implementations of the present disclosure, the processing device maintains an LWC for each of the SMUs 310-340 of the memory device 130. In at least some implementations, this involves maintaining a single shared. LWC base, which represents the MSBs of the LWCs of all of the SMUs 310-340 of the memory device 130, as well as separate, SMU-specific LWC offsets 610-640 that represent the LSBs of the LWCs of the various SMUs 310-340 of the memory device 130. This type of implementation provides the context for this description of the method 900 of FIG. 9.

The method 900 includes operations that the processing device performs in at least one implementation as part of performing the operation 818 of the method 800 of FIG. 8, which involves the processing device incrementing the LWC offset 620, and more broadly involves the processing device incrementing the LWC that the processing device maintains for the SMU 320. In at least one implementation of the present disclosure, the MSBs of that LWC are stored as the shared LWC base in a register in the LWC-base register file 170, which is external to the SMU-management table 160, while the LSBs of that LWC are stored as the LWC offset 620 among the LWC offsets 610-640 in the LWC segment 404 of the SMU-management table 160.

Furthermore, in this example, 3 bits are reserved for each of the LWC offsets 610-640, and each of the LWC offsets 610-640 can therefore take on values in the range 0-7 (decimal), inclusive. Accordingly, the maximum allowed value for an LWC offset (referred to herein as the LWC-offset max) is 7. The processing device begins performing the sub-method 900 at operation 902, at which the processing device evaluates whether the LWC offset 620 is less than the quantity (LWC-offset max−1). If so, the processing device simply increments the LWC offset 620 (see operation 904), and the method 900 thereafter returns to the method 800 (see operation 906).

If, however, the processing device determines at operation 902 that the LWC offset 620 is not less than the quantity (LWC-offset max−1), the processing device proceeds to evaluate, at operation 908, whether the LWC offset 620 is in fact equal to that same quantity. It is noted that the referenced quantity (LWC-offset max−1) is an example expression of a parameter that is referred to herein as an LWC-offset check threshold, which is a threshold that the processing device uses in some implementations to verify that, as a general matter, write operations are being directed among the SMUs 310-340 in such a way as to keep all of the SMUs 310-340 within a certain range of lifetime use as one another. Moreover, the LWC-offset check threshold is not used in some implementations, and in other implementations is equal to a value other than (LWC-offset max−1), as that value is used herein by way of example and not limitation.

Returning to the operations of the method 900, if the processing device determines at operation 908 that the LWC offset 620 is equal to the quantity (LWC-offset max−1), control then proceeds to operation 910, at which the processing device checks an error condition related to the considerations listed in the preceding paragraph regarding whether or not the lifetime use of the SMUs 310-340 is within a tolerance of one another. In particular, as an example, at operation 910, the processing device evaluates whether any of the LWC offsets other than the LWC offset 620—in this case, the LWC offset 610, the LWC offset 630, and the LWC offset 640—have a current value that is less than the difference between (i) a value that is referred to herein as the LWC-offset range size and (ii) a value that is referred to herein as the LWC-base increment size.

As stated, in this example, any one of the LWC offsets 610-640 can, at any given time, have any value in the range 0-7 (decimal), inclusive; accordingly, because there are 8 different values in that range, the LWC-offset range size in this example is 8. Moreover, in this example, the LWC-base increment size is 4. In this case, the LWC-base increment size is calculated as being one-half of the LWC-offset range size, though this is not required. The LWC-base increment size could take on other values that are less than the LWC-offset range size.

If the processing device determines at operation 910 that at least one of the LWC offset 610, the LWC offset 630, and the LWC offset 640 is less than the difference that can be expressed as (LWC-offset range size−LWC-base increment size), this represents the error condition being true, and the processing device responsively triggers an LWC-offset-imbalance event (e.g., an alert or error message) to be stored in, e.g., the firmware of the processing device (see operation 912). In other implementations, the processing device may also or instead take one or more other responsive actions, perhaps up to and including disabling further use of the memory device 130.

In the depicted embodiment, after performing the operation 912, the 15 increments the LWC offset 620 (see operation 904) and the method 900 then returns to the method 800 (see operation 906). As can be seen in FIG. 9, these are the same two operations that the processing device performs if the processing device determines at operation 910 that none of the LWC offset 610, the LWC offset 630, and the LWC offset 640 are less than the difference between the LWC-offset range size and the LWC-base increment size.

Returning now to operation 908, if the processing device determines there that the LWC offset 620 is not equal to the LWC-offset check threshold, which in this example is equal to the quantity (LWC-offset max−1), control proceeds to operation 914. It is noted that, taken together, determinations in the negative at both operation 902 and operation 904 amount to a determination that the LWC offset 620 is not less than and is in fact equal to the LWC-offset max. In implementations that do not involve using the LWC-check threshold to check the above-described error condition, then, the operations 902 and 904 could be combined into a single operation that evaluates whether the LWC offset 620 is less than the LWC-offset max.

Figure 10:
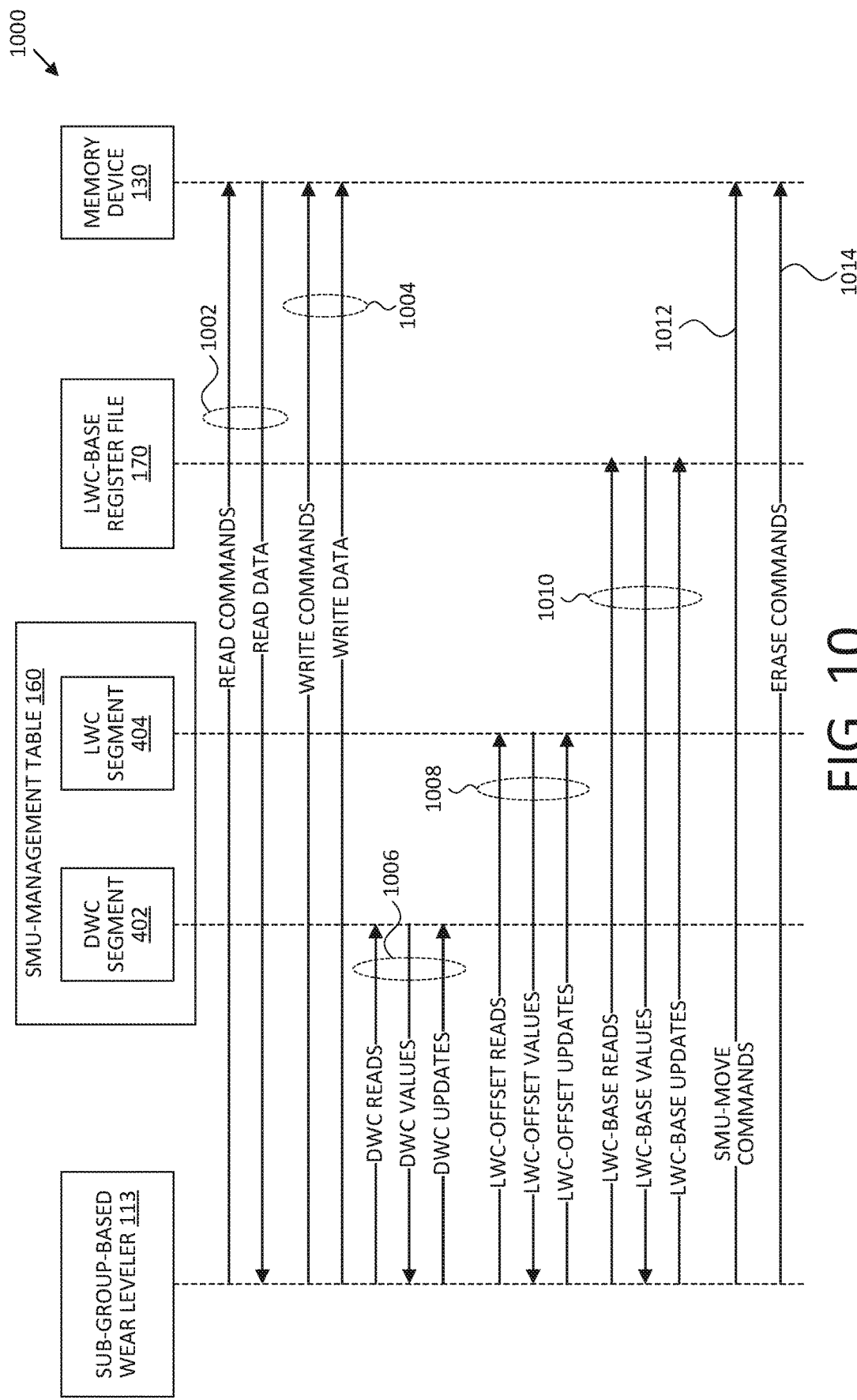
FIG. 10 is a message flow diagram depicting communications among various functional components of the memory sub-system controller and an example memory device of FIG. 1 in accordance with some embodiments of the present disclosure.

At operation 914, responsive to determining that the LWC offset 620 is equal to the LWC-offset max, the processing device reduces all of the LWC offsets 610-640 for the SMUs 310-340 in the memory device 130 by the above-described LWC-base increment size. The processing device also increases the shared LWC base, which is stored in a register in the LWC-base register file 170, by the LWC-base increment size (see operation 916). By the combination of these two operations 914 and 916, then, no LWC information is lost, and the current LWC of any given SMU 310-340 can be determined at any time by using the shared LWC base as the MSBs of that current LWC and the current LWC offset 610-640 as the LSBs of that current LWC. It is noted that this works because of the above-referenced policy of the processing device to keep the various SMUs 310-340 within a threshold amount of lifetime use as one another, a condition that is verified by checking for (the absence of) the above-described error condition. After performing the operations 914 and 916, the method 900 returns to the method 800 (see operation 906). Lastly, it is noted that, although not pictured, in some implementations, the method 900 may also involve the processing device evaluating whether the LWC of the SMU 320 (or any of the SMUs 310-340) has reached a lifetime LWC FIG. 10 is a message flow diagram that depicts a message flow 1000 that shows some example communications that can occur in some implementations of the present disclosure among various functional components of the memory sub-system controller 115 and the memory device 130. The functional components of the memory sub-system controller 115 that are depicted in the message flow 1000 are the sub-group-based wear leveler 113, the DWC segment 402 and the LWC segment 404 as part of the SMU-management table 160, and the LWC-base register file 170. Moreover, it is noted that time is not intended to be depicted to scale in the message flow 1000.

As shown in the message flow 1000, the sub-group-based wear leveler 113 may transmit read commands to and receive corresponding read data from the memory device 130, as indicated at 1002. Furthermore, the sub-group-based wear leveler 113 may transmit write commands and corresponding data to be written to the memory device 130, as indicated at 1004. The transmission of these write commands and write data at 1004 could correspond to the above-mentioned write operations that the memory sub-system controller 115 directs to the memory device 130. In this depiction, it is the sub-group-based wear leveler 113 in particular that directs these write commands to the memory device 130. Each write command could be directed to a particular sub-group 311-314, 321-324, 331-334, 341-344 of a particular SMU 310-340 of the memory device 130.

Moreover, as indicated at 1006, in various implementations, the sub-group-based wear leveler 113 rimy send DWC-read requests to the DWC segment 402 to request the values of one or more of the SMU-level DWCs 510-540 and/or one or more of the sub-group-level DWCs 511-514, 521-524, 531-534, 541-544 that are stored in the DWC segment 402. The sub-group-based wear leveler 113 may receive the requested DWC values from the DWC segment 402, and may further send DWC updates (e.g., incremented values, instructions to increment, reset values, instructions to reset) to the DWC segment 402 with respect to the SMU-level DWCs 510-540 and/or one or more of the sub-group-level DWCs 511-514, 521-524, 531-534, 541-544.

The sub-group-based wear leveler 113 may also, as indicated at 1008, send LWC-offset read requests to the LWC segment 404 to request the values of one or more of the LWC offsets 610-640 that are stored in the LWC segment 404. The sub-group-based wear leveler 113 may receive the requested LWC-offset values from the LWC segment 404, and may further send. LWC-offset updates incremented values, instructions to increment) to the LWC segment 404 with respect to one or more of the LWC offsets 610-640. As indicated at 1010, the sub-group-based wear leveler 113 may engage in similar operations of sending read requests to, receiving values from, and sending updates to the LWC-base register file 170 in connection with the shared LWC base.

At any given time, the sub-group-based wear leveler 113 may use values received from the DWC segment 402 to calculate a current SMU-level DWC for any given SMU 310-340 and/or a current sub-group-level DWC for any given sub-group 311-314, 321-324, 331-334, 341-344, or perhaps a current combined DWC as described herein. Instead or in addition, at any given time the sub-group-based wear leveler 113 may use values received from the LWC segment 404 and the LWC-base register file 170 to calculate a current LWC for any given SMU 310-340.

As is also depicted in the message flow 1000, the sub-group-based wear leveler 113 may also transmit SMU-move commands to the memory device 130 from time to time, as indicated at 1012, instructing the memory device 130 to perform an SMU-move operation from one SMU (e.g., the SMU 320) to another SMU (e.g., the SMU 340), perhaps as an SMU-turnover operation performed in response to determining that a sub-group-level DWC (e.g., the sub-group-level DWC 523) for a subgroup (e.g., the sub-group 323) has reached the SMU-move threshold. Finally, perhaps also as an SMU-turnover operation, and as indicated at 1014, the sub-group-based wear leveler 113 may instruct the memory device 130 to erase certain data, perhaps the data in the SMU 320 after the SMU-move operation to the SMU 340 has been performed, to make the SMU 320 available for a future SMU-move operation directed to the SMU 320 as a destination SMU.

Figure 11:
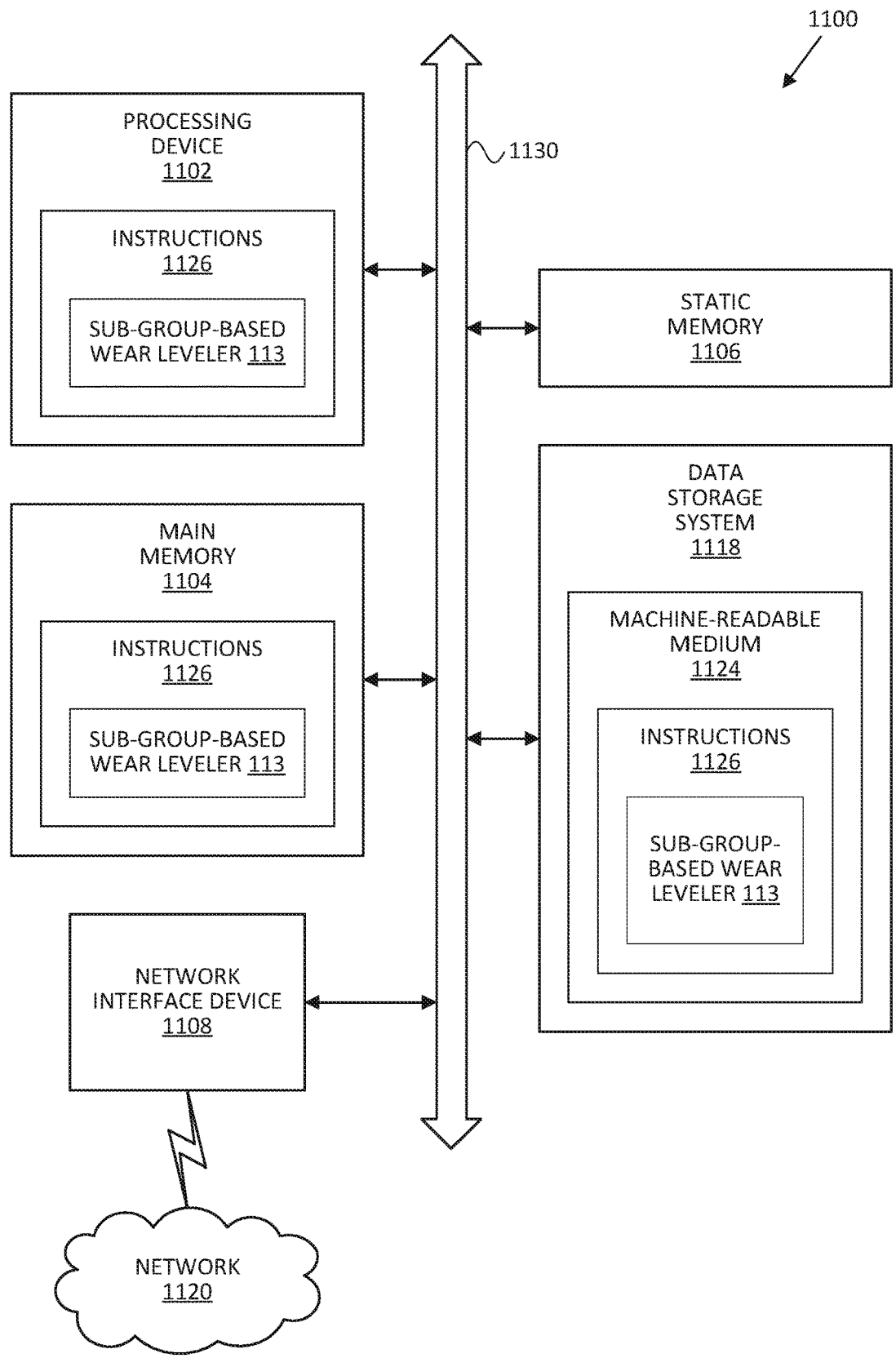
FIG. 11 is a block diagram of an example computer system in which embodiments of the present disclosure may operate.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1) that includes, is coupled to, or utilizes a memory sub-system the memory sub-system 110 of FIG. 1) or can be used to perform the operations of a controller (e.g., to execute an operating system to perform operations corresponding to the sub-group-based wear leveler 113 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., ROM, flash memory, DRAM such as SDRAM or RDRAM, etc.), a static memory 1106 (e.g., flash memory, SRAM, etc.), and a data storage system 1118, which communicate with each other via a bus 1130.

The processing device 1102 represents one or more general-purpose processing devices such as a microprocessor, a central processing unit (CPU), or the like. More particularly, the processing device 1102 can be a complex instruction set computing (CISC) microprocessor, a reduced instruction set computing (RISC) microprocessor, a very long instruction word (VLIW) microprocessor, or a processor implementing other instruction sets, or processors implementing a combination of instruction sets. The processing device 1102 can also be one or more special-purpose processing devices such as an ASIC, an FPGA, a digital signal processor (DSP), a network processor, or the like. In at least one embodiment, the processing device 1102 is configured to execute instructions 1126 for performing the operations discussed herein. The computer system 1100 can further include a network interface device 1108 to communicate over a network 1120.

The data storage system 1118 can include a machine-readable storage medium 1124 (also known as a computer-readable medium) on which is stored one or more sets of instructions 1126 or software embodying any one or more of the methodologies or functions described herein. The instructions 1126 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1.

In an embodiment, the instructions 1126 include instructions to implement functionality corresponding to a sub-group-based wear leveler (e.g., the sub-group-based wear leveler 113 of FIG. 1). While the machine-readable storage medium 1124 is shown in an example embodiment to be a single medium, the term "machine-readable storage medium" should be taken to include a single medium or multiple media that store the one or more sets of instructions. The term "machine-readable storage medium" should also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed description have been presented in terms of algorithms and symbolic representations of operations on data bits within a computer memory. These algorithmic descriptions and representations are the ways that are used by those skilled in the data-processing arts to most effectively convey the substance of their work to others skilled in such arts. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and/or otherwise manipulated. It has proven convenient at times, principally for reasons of common usage, to refer to these signals as bits, values, elements, symbols, characters, terms, numbers, and/or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within a computer system's registers and memories into other data similarly represented as physical quantities within the computer system's registers and memories or other such information-storage systems.

The present disclosure also relates to an apparatus for performing the operations that are described herein. This apparatus can be specially constructed for the intended purposes, or it can include a general-purpose computer selectively activated or reconfigured by a computer program stored in the computer. Such a computer program can be stored in a computer-readable storage medium such as but not limited to any type of disk including floppy disks, optical disks, CD-ROMs, magnetic-optical disks, ROMs, RAMs, EPROMs, EEPROMs, magnetic or optical cards, and/or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the present disclosure. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic device or devices) to perform a process according to the present disclosure. A machine-readable medium includes any mechanism for storing information in a form readable by a machine (e.g., a computer). In some implementations, a machine-readable (e.g., computer-readable) medium includes a machine-readable (e.g., computer-readable) storage medium such as a ROM, RAM, magnetic disk storage media, optical storage media, flash memory devices, and/or the like.

In the foregoing specification, some example implementations of the disclosure have been described. It will be evident that various modifications can be made thereto without departing from the broader scope and spirit of the disclosure as set forth in the following claims. The specification and drawings are, accordingly, to be regarded in an illustrative sense rather than in a restrictive sense. Below is a non-exhaustive list of examples of implementations of the present disclosure.

Example 1 is a system that includes a plurality of memory components, each memory component including a plurality of management groups, each management group including a plurality of sub-groups; and a processing device, operatively coupled with the plurality of memory components to perform wear-leveling operations, the wear-leveling operations including maintaining a sub-group-level DWC for each of the sub-groups of each of the management groups of a memory component in the plurality of memory components; and determining, in connection with a first write operation to a first sub-group of a first management group of the memory component, that a first sub-group-level DWC for the first sub-group equals a management-group-move threshold, and responsively performing a set of one or more management-group-turnover operations, where the set of management-group-turnover operations includes triggering a management-group-move operation from the first management group to a second management group of the memory component.

Example 2 is the subject matter of Example 1, where the set of management-group-turnover operations further comprises resetting the sub-group-level DWCs for each of the sub-groups of the first management group.

Example 3 is the subject matter of either Example 1 or Example 2, where the wear-leveling operations further include maintaining a management-group-level DWC for each of the management groups of the memory component, and where determining that the first sub-group-level DWC equals the management-group-move threshold includes determining that (i) the first sub-group-level DWC is equal to a sub-group-level-DWC maximum and (ii) a first management-group-level DWC for the first management group is equal to a management-group-level-DWC maximum.

Example 4 is the subject matter of Example 3, where the management-group-level DWCs and the sub-group-level DWCs are maintained in a management table that is stored on the processing device.

Example 5 is the subject matter of either Example 3 or Example 4, where the set of management-group-turnover operations further includes resetting the first management-group-level DWC; and resetting the sub-group-level DWCs for each of the sub-groups of the first management group.

Example 6 is the subject matter of any of Examples 3-5, where the wear-leveling operations further include determining, in connection with a second write operation to the first sub-group, that the first sub-group-level DWC is less than the sub-group-level-DWC maximum, and responsively incrementing the first sub-group-level DWC.

Example 7 is the subject matter of any of Examples 3-6, where the wear-leveling operations further include determining, in connection with a third write operation to the first sub-group, that (i) the first sub-group-level DWC is equal to the sub-group-level-DWC maximum and (ii) the first management-group-level DWC is less than the management-group-level-DWC maximum, and responsively (i) resetting the sub-group-level DWCs for each of the sub-groups of the first management group and (ii) incrementing the first management-group-level DWC.

Example 8 is the subject matter of any of Examples 1-7, where the wear-leveling operations further include maintaining an LWC for each of the management groups of the memory component.

Example 9 is the subject matter of Example 8, where each LWC has an MSB portion and an LSB portion; a single shared LWC base represents the MSB portion of the LWCs of all of the management groups of the memory component; separate, management-group-specific LWC offsets represent the LSB portions of the LWCs of the management groups of the memory component; and the set of management-group-turnover operations further includes incrementing a first LWC for the first management group.

Example 10 is the subject matter of Example 9, where the LWC offsets are stored in a management table on the processing device; and the shared LWC base is stored external to the management table on the processing device.

Example 11 is the subject tatter of either Example 9 or Example 10, where incrementing the first LWC includes determining whether a first LWC offset for the first management group is less than or equal to an LWC-offset maximum; if the first LWC offset is less than the LWC-offset maximum, then incrementing the first LWC offset; and if the first LWC offset is equal to the LWC-offset maximum, then (i) reducing the LWC offsets for each of the management groups of the memory component by an LWC-base increment size and (ii) increasing the shared LWC base for the memory component by the LWC-base increment size.

Example 12 is the subject matter of Example 11, where incrementing the first LWC further includes: if the first LWC offset is less than the LWC-offset maximum, then determining whether the first LWC offset is equal to an LWC-offset check threshold, and if so then determining whether at least one of the LWC offsets, other than the first LWC offset, for the first memory component is less than a difference between an LWC-offset range and the LWC-base increment size, and if so then triggering an LWC-offset-imbalance event to a firmware of the processing device.

Example 13 is a method that includes maintaining a sub-group-level DWC for each of a plurality of sub-groups of each of a plurality of management groups of a memory component; and determining, in connection with a first write operation to a first sub-group of a first management group of the memory component, that a first sub-group-level DWC for the first sub-group equals a management-group-move threshold, and responsively performing a set of one or more management-group-turnover operations, where the set of management-group-turnover operations includes triggering a management-group-move operation from the first management group to a second management group of the memory component.

Example 14 is the subject matter of Example 13, further including maintaining a management-group-level DWC for each of the management groups of the memory component, where determining that the first sub-group-level DWC equals the management-group-move threshold includes determining that (i) the first sub-group-level DWC is equal to a sub-group-level-DWC maximum and (ii) a first management-group-level DWC for the first management group is equal to a management-group-level-DWC maximum.

Example 15 is the subject matter of either Example 13 or Example 14, further including determining, in connection with a second write operation to the first sub-group, that the first sub-group-level DWC is less than the sub-group-level-DWC maximum, and responsively incrementing the first sub-group-level DWC.

Example 16 is the subject matter of either Example 14 or Example 15, further including determining, in connection with a third write operation to the first sub-group, that (i) the first sub-group-level DWC is equal to the sub-group-level-DWC maximum and (ii) the first management-group-level DWC is less than the management-group-level-DWC maximum, and responsively (i) resetting the sub-group-level DWCs for each of the sub-groups of the first management group and (ii) incrementing the first management-group-level DWC.

Example 17 is the subject matter of any of Examples 13-16, further including maintaining an LWC for each of the management groups of the memory component.

Example 18 is the subject matter of Example 17, where each LWC has an MSB portion and an LSB portion; a single shared LWC base represents the MSB portion of the LWCs of all of the management groups of the memory component; separate, management-group-specific LWC offsets represent the LSB portions of the LWCs of the management groups of the memory component; and the set of management-group-turnover operations further includes incrementing a first LWC for the first management group.

Example 19 is the subject matter of Example 18, where incrementing the first LWC includes determining whether a first LWC offset for the first management group is less than or equal to an LWC-offset maximum; if the first LWC offset is less than the LWC-offset maximum, then incrementing the first LWC offset; and if the first LWC offset is equal to the LWC-offset maximum, then (i) reducing the LWC offsets for each of the management groups of the memory component by an LWC-base increment size and (ii) increasing the shared LWC base for the memory component by the LWC-base increment size.

Example 20 is a non-transitory machine-readable storage medium containing instructions that, when executed by a processing device, cause the processing device to perform operations including maintaining a sub-group-level DWC for each of a plurality of sub-groups of each of a plurality of management groups of a memory component; and determining, in connection with a first write operation to a first sub-group of a first management group of the memory component, that a first sub-group-level DWC for the first sub-group equals a management-group-move threshold, and responsively performing a set of one or more management-group-turnover operations, where the set of management-group-turnover operations includes triggering a management-group-move operation from the first management group to a second management group of the memory component.

What is claimed is:

1. A system comprising:
a plurality of memory components, each memory component comprising a plurality of management groups, each management group including a plurality of sub-groups; and
a processing device, operatively coupled with the plurality of memory components to perform wear-leveling operations, the wear-leveling operations comprising:
maintaining a sub-group-level delta write counter (DWC) for each of the sub-groups of each of the management groups of a memory component in the plurality of memory components;
maintaining a life write counter (LWC) for each of the management groups of the memory component, each LWC having a most-significant-bits (MSB) portion and a least-significant-bits (LSB) portion, a single shared LWC base representing the MSB portion of the LWCs of all of the management groups of the memory component, and separate, management-group-specific LWC offsets represent the LSB portions of the LWCs of the management groups of the memory component; and
determining, in connection with a first write operation to a first sub-group of a first management group of the memory component, that a first sub-group-level DWC for the first sub-group equals a management-group-move threshold, and in response: moving user data from the first management group to a second management group of the memory component; and incrementing a first LWC for the first management group.

2. The system of claim 1, wherein the wear-leveling operations further comprise:
in response to the determining that the first sub-group-level DWC for the first sub-group equals the management-group-move threshold, resetting the sub-group-level DWCs for each of the sub-groups of the first management group.

3. The system of claim 1, the wear-leveling operations further comprising:
maintaining a management-group-level DWC for each of the management groups of the memory component, wherein determining that the first sub-group-level DWC equals the management-group-move threshold comprises determining that:
the first sub-group-level DWC is equal to a sub-group-level-DWC maximum; and
a first, management-group-level DWC for the first management group is equal to a management-group-level-DWC maximum.

4. The system of claim 3, wherein the management-group-level DWCs and the sub-group-level DWCs are maintained in a management table that is stored on the processing device.

5. The system of claim 3, wherein the wear-group-level operations further comprise:
in response to the determining that the first sub-group-level DWC for the first sub-group equals the management-group-move threshold:
resetting the first management-group-level DWC; and
resetting the sub-group-level DWCs for each of the sub-groups of the first management group.

6. The system of claim 3, the wear-leveling operations further comprising:
determining, in connection with a second write operation to the first sub-group, that the first sub-group-level DWC is less than the sub-group-level-DWC maximum, and
responsively incrementing the first sub-group-level DWC.

7. The system of claim 3, the wear-leveling operations further comprising:
determining, in connection with a third write operation to the first sub-group, that:
the first sub-group-level DWC is equal to the sub-group-level-DWC maximum; and
the first management-group-level DWC is less than the management-group-level-DWC maximum, and responsively:
resetting the sub-group-level DWCs for each of the sub-groups of the first management group; and
incrementing the first management-group-level DWC.

8. The system of claim 1, wherein:
the LWC offsets are stored in a management table on the processing device; and
the shared LWC base is stored external to the management table on the processing device.

9. The system of claim 1, wherein incrementing the first LWC comprises:
determining whether a first LWC offset for the first management group is less than or equal to an LWC-offset maximum;
if the first LWC offset is less than the LWC-offset maximum, then:
incrementing the first LWC offset; and
if the first LWC offset is equal to the LWC-offset maximum, then:
reducing the LWC offsets for each of the management groups of the memory component by an LWC-base increment size; and
increasing the shared LWC base for the memory component by the LWC-base increment size.

10. The system of claim 9, wherein incrementing the first LWC further comprises:
if the first LWC offset is less than the LWC-offset maximum, then:
determining whether the first LWC offset is equal to an LWC-offset check threshold, and if so then:
determining whether at least one of the LWC offsets, other than the first LWC offset, for the memory component is less than a difference between an LWC-offset range and the LWC-base increment size, and if so then triggering an LWC-offset-imbalance event to a firmware of the processing device.

11. A method comprising:
maintaining a sub-group-level delta write counter (DWC) for each of a plurality of sub-groups of each of a plurality of management groups of a memory component;
maintaining a life write counter (LWC) for each of the management groups of the memory component, each LWC having a most-significant-bits (MSB) portion and a least-significant-bits (LSB) portion, a single shared LWC base representing the MSB portion of the LWCs of all of the management groups of the memory component, and separate, management-group-specific LWC offsets represent the LSB portions of the LWCs of the management groups of the memory component; and determining, in connection with a first write operation to a first sub-group of a first management group of the memory component, that a first sub-group-level DWC for the first sub-group equals a management-group-move threshold, and in response:

moving user data from the first management group to a second management group of the memory component; and incrementing a first LWC for the first management group.

12. The method of claim 11, further comprising:

maintaining a management-group-level DWC for each of the management groups of the memory component, wherein the determining that the first sub-group-level DWC equals the management-group-move threshold comprises determining that:

the first sub-group-level DWC is equal to a sub-group-level-DWC maximum; and a first management-group-level DWC for the first management group is equal to a management-group-level-DWC maximum.

13. The method of claim 12, further comprising:

determining, in connection with a second write operation to the first sub-group, that the first sub-group-level DWC is less than the sub-group-level-DWC maximum, and responsively incrementing the first sub-group-level DWC.

14. The method of claim 12, further comprising:

in response to determining, in connection with a third write operation to the first sub-group, that the first sub-group-level DWC is equal to the sub-group-level-DWC maximum and the first management-group-level DWC is less than the management-group-level-DWC maximum:

resetting the sub-group-level DWCs for each of the sub-groups of the first management group; and incrementing the first management-group-level DWC.

15. The method of claim 11, wherein incrementing the first LWC comprises:

determining whether a first MC offset for the first management group is less than or equal to an MC-offset maximum;

if the first LWC offset is less than the LWC-offset maximum, then:

incrementing the first LWC offset; and if the first LWC offset is equal to the LWC-offset maximum, then:

reducing the LWC offsets for each of the management groups of the memory component by an LWC-base increment size; and increasing the shared LWC base for the memory component by the LWC-base increment size.

16. A non-transitory machine-readable storage medium containing instructions that, when executed by a processing device, cause the processing device to perform operations comprising:

maintaining a sub-group-level delta write counter (DWC) for each of a plurality of sub-groups of each of a plurality of management groups of a memory component;

maintaining a life write counter (LWC) for each of the management groups of the memory component, each LWC having a most-significant-bits (MSB) portion and a least-significant-bits (LSB) portion, a single shared LWC base representing the MSB portion of the LWCs of all of the management groups of the memory component, and separate, management-group-specific LWC offsets represent the LSB portions of the LWCs of the management groups of the memory component; and determining, in connection with a first write operation to a first sub-group of a first management group of the memory component, that a first sub-group-level DWC for the first sub-group equals a management-group-move threshold, and in response:

moving user data from the first management group to a second management group of the memory component; and incrementing a first LWC for the first management group.

17. The non-transitory machine-readable storage medium of claim 16, wherein the operations further comprise:

in response to the determining that the first sub-group-level DWC for the first sub-group equals the management-group-move threshold, resetting the sub-group-level DWCs for each of the sub-groups of the first management group.

18. The non-transitory machine-readable storage medium of claim 16, wherein the operations further comprise:

maintaining a management-group-level DWC for each of the management groups of the memory component, wherein determining that the first sub-group-level DWC equals the management-group-move threshold comprises determining that:

the first sub-group-level DWC is equal to a sub-group-level-DWC maximum; and a first management-group-level DWC for the first management group is equal to a management-group-level-DWC maximum.

19. The non-transitory machine-readable storage medium of claim 18, wherein the management-group-level DWCs and the sub-group-level DWCs are maintained in a management table that is stored on the processing device.

20. The non-transitory machine-readable storage medium of claim 18, wherein the operations further comprise:

in response to the determining that the first sub-group-level DWC for the first sub-group equals the management-group-move threshold:

resetting the first management-group-level DWC; and resetting the sub-group-level DWCs for each of the sub-groups of the first management group.

* * * * *